United States Patent
Tekeuchi et al.

[11] Patent Number: 5,919,715
[45] Date of Patent: Jul. 6, 1999

[54] METHOD FOR CLEANING A SEMICONDUCTOR SURFACE

[75] Inventors: Tetsuya Tekeuchi, Kawasaki; Yawara Kaneko, Kanagawa, both of Japan

[73] Assignee: Hewlett-Packard Company, Palo Alto, Calif.

[21] Appl. No.: 09/018,776

[22] Filed: Feb. 4, 1998

[30] Foreign Application Priority Data

Feb. 17, 1997 [JP] Japan .................................. 9-048402

[51] Int. Cl.$^6$ .......................... H01L 21/00; C23G 1/02
[52] U.S. Cl. ................... 438/745; 134/3; 134/28
[58] Field of Search .................... 134/3, 28; 438/604, 438/745, 906

[56] References Cited

U.S. PATENT DOCUMENTS

| | | | |
|---|---|---|---|
| 3,683,240 | 8/1972 | Pankove .................................. | 317/234 |
| 4,100,014 | 7/1978 | Kuhn-Kuhnenfeld et al. .......... | 156/647 |
| 5,106,771 | 4/1992 | Emerson et al. ......................... | 437/40 |
| 5,472,513 | 12/1995 | Shiramizu .................................. | 134/3 |
| 5,681,398 | 10/1997 | Muraoka .................................. | 134/3 |

FOREIGN PATENT DOCUMENTS

| | | |
|---|---|---|
| 0 459 469 | 12/1991 | European Pat. Off. . |
| 53-043480 | 4/1978 | Japan . |

OTHER PUBLICATIONS

Q. A. Liu et al., Room Temperature Epitaxy of Pd Fllms of GaN under Conventional Vacuum Conditions, Appl. Phys. Lett., vol. 69, 1996, pp. 1722–1724.

P. Hacke et al., "Schottky Barrier on n–type GaN Grown by Hydride Vapor Phase Eiptaxy", Appl. Phys. Lett., vol. 63, 1993, pp. 2676–2678.

A. T. Ping et al., "Characterisation of Pd Schottky Barrier on n–type GaN", Electronics Letters, vol. 32, 1996, pp. 68–70.

*Primary Examiner*—Thi Dang
*Assistant Examiner*—Alva C Powell

[57] ABSTRACT

An improved method for cleaning a group III-nitride-based semiconductor surface prior to depositing electrodes or growing additional layers of semiconductor. In a cleaning method according to the present invention, the surface of the semiconductor is brought into contact with an etchant solution that includes hydrofluoric acid. The etching step is preferably carried out at a HF concentration greater than 5% and at a temperature between 10 to 100° C. in an inert atmosphere. The etchant solution may also include other acids. Group III-nitride semiconductor devices cleaned in this manner require lower driving voltages than devices cleaned with prior art methods.

6 Claims, 1 Drawing Sheet

METHOD FOR CLEANING A SEMICONDUCTOR SURFACE

FIELD OF THE INVENTION

The present invention relates to methods for cleaning semiconductor surfaces, and more particularly, to a method for cleaning a group III-nitride semiconductor surface before forming electrodes thereon or before homoepitaxial growth of additional semiconductor layers thereon.

BACKGROUND OF THE INVENTION

Group III-nitride semiconductors such as GaN are useful in fabricating light emitting elements that emit in the blue region of the optical spectrum. These elements include light emitting diodes and laser diodes. The light emitting elements are typically fabricated by creating a p-n diode structure on substrate. The diode is constructed from layers of group III-nitride semiconducting materials that are homoepitaxially grown. After the appropriate layers are grown and etched back to provide access to the bottom layer of the p-n diode, electrodes are formed on the p-type and n-type layers to provide the electrical connections for driving the light emitting element.

The electrodes are formed by depositing metals on the semiconductor surface. If the surface is not cleaned to remove any oxide that has formed on the surface, the contact resistance between an electrode and the semiconductor becomes large. This large contact resistance increases the voltage needed to drive the light emitting element. Furthermore, the drive voltage from device to device is not consistent because the level of oxide present is highly variable.

Similarly, if the semiconductor surface is not cleaned prior to homoepitaxial growth, the homoepitaxial growth will not occur properly. As a result, high performance light-emitting elements cannot be formed.

The cleaning systems developed for other semiconductor systems do not work adequately for group III-nitride semiconductors. For example, cleaning systems for GaAs-based semiconductors or indium phosphide-based semiconductors use sulfuric acid or ammonia based etchants. However, these etchant systems when applied to group III-nitride semiconductors do not adequately clean the surface. Consequently, when electrodes are formed on a GaN-based semiconductor after using these prior art methods, the current and voltage characteristics between the electrode and the GaN semiconductor exhibited a large Schottky barrier. To overcome this barrier, an increase in the driving voltage is needed.

Similarly, if these prior art cleaning systems are used before homoepitaxial growth on a conventional GaN semiconductor, the resulting crystallinity is poorer than that observed in GaAs system devices.

Broadly, it is the object of the present invention to provide an improved method for cleaning the surface of group III-nitride semiconductors.

It is a further object of the present invention to provide a cleaning method that decreases the drive voltage for the resultant semiconductor device.

These and other objects of the present invention will become apparent to those skilled in the art from the following detailed description of the invention and the accompanying drawings.

SUMMARY OF THE INVENTION

The present invention is an improved method for cleaning a group III-nitride-based semiconductor surface prior to depositing electrodes or growing additional layers of semiconductor. In a cleaning method according to the present invention, the surface of the semiconductor is brought into contact with an etchant solution that includes hydrofluoric acid. The etching step is preferably carried out at a HF concentration greater than 5% and at a temperature between 10 to 100° C. in an inert atmosphere. The etchant solution may also include other acids.

DETAILED DESCRIPTION OF THE INVENTION

Figure 1:
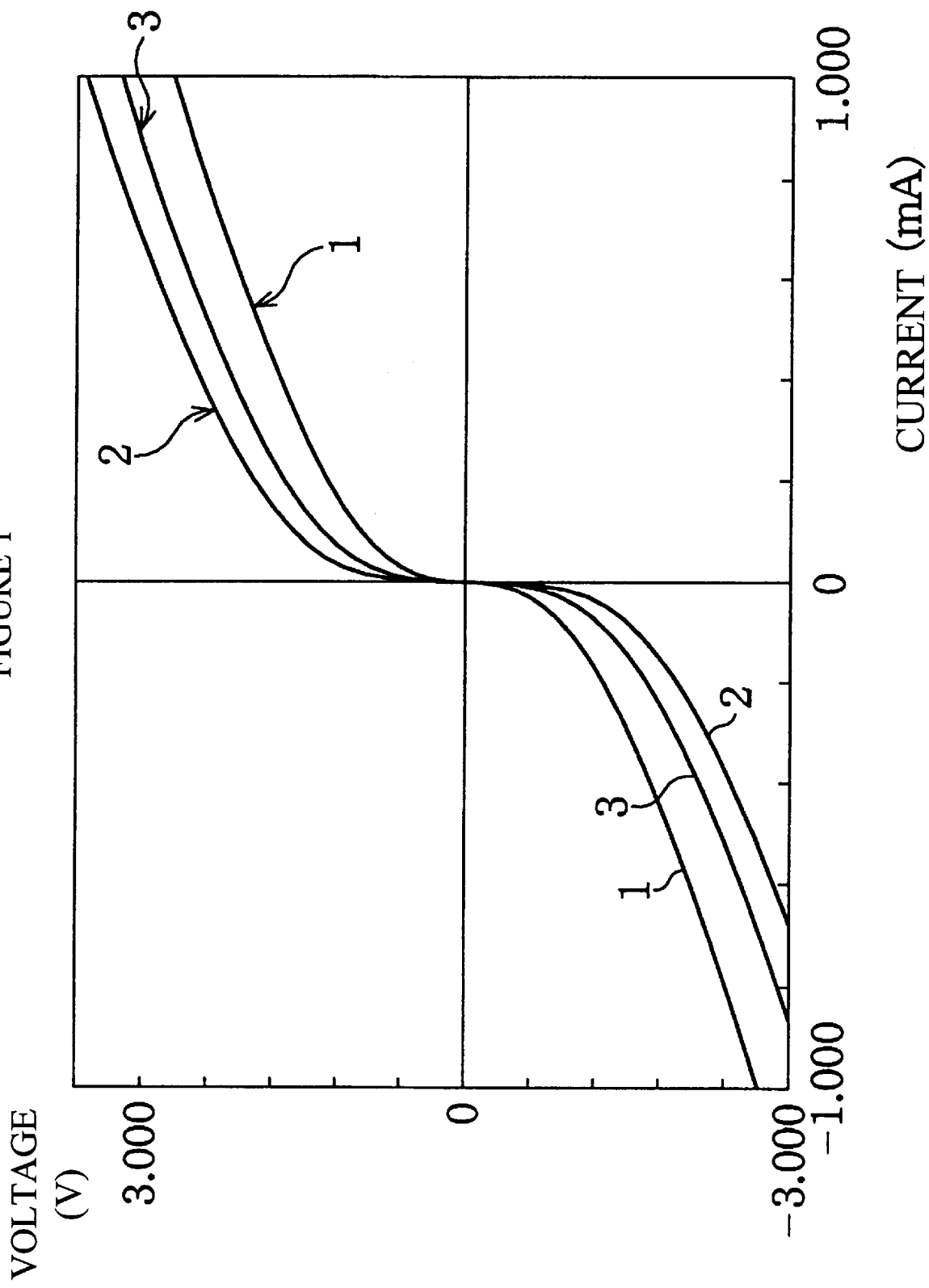
FIG. 1 is comparative graph of the current versus voltage curves obtained with group III-nitride semiconductors cleaned by the method of the present invention and two control other methods.

The present invention is based on the experimental observation that hydrofluoric acid etchant systems such as those used for forming mirror surfaces on a silicon-based semiconductor act as an effective etchant for group III-nitride semiconductors. The method of the present invention can be applied to group III-nitride semiconductors such as semiconductors based on GaN, AlN, AlGaN, and GaInN.

The hydrofluoric acid system etchant of the present invention utilizes hydrofluoric acid or an acid mixture containing hydrofluoric acid. For example, the hydrofluoric acid may be mixed with nitric acid or hydrochloric acid. The manner in which a group III-nitride semiconductor surface is cleaned by the method of the present invention involves four steps. First, the surface of the semiconductor is cleaned with an organic solvent-based solution. The preferred organic solvents are trichloroethylene, acetone, methanol, or isopropanol. These compounds may be used independently or in combinations of two or more. Cleaning methods based on such organic solvents are well known in the semiconductor arts, and hence, will not be discussed in detail here.

Next, the semiconductor surface is rinsed with water. Purified water generated by ion exchange or distillation is preferred. Such rinsing procedures are well known in the semiconductor arts, and hence, will not be discussed in detail here.

Third, the semiconductor is then subjected to a hydrofluoric acid-based etchant. The hydrofluoric acid is preferably applied in an aqueous solution at a concentration greater than 5%. However, the concentration is not critical. If the concentration is too low, the time needed to clean the surface becomes too long.

As noted above, the hydrofluoric acid may be applied in combination with one or more additional acids. The ratio of the acids in the mixture and the concentration of the other acid are not particularly critical. In the preferred embodiment of the present invention, the hydrofluoric acid is present in the above discussed concentration range.

The temperature at which the etchant is applied is also not particularly critical. In general, a temperature range from 10 to 100° C. is preferred. If the temperature of the hydrofluoric acid system etchant is too low, the time required to achieve the desired degree of cleanliness becomes too long to provide a cost-effective process. The preferred treatment time is from about 30 seconds to 60 minutes.

The treatment may be carried out in air at room temperature and atmospheric pressure. However, to prevent re-growth of an oxide film on the surface of the semiconductor, the etching operation is preferably carried out in the presence of an inert gas, such as nitrogen, and at a lower temperature.

In the preferred embodiment of the present invention, the etching operation is carried out by immersing the semiconductor in the etchant solution in a suitable container. In principle, the etchant can also be applied spraying for the aforementioned treatment time. However, achieving uniform delivery of the solution by spraying with a nozzle over the entire surface is difficult. Similarly, the etchant may be applied by placing the semiconductor in an elongated container through which the etchant flows at a predetermined rate over the semiconductor. However, the length of the container and control of the flow rate of the hydrofluoric acid etchant become critical. Finally, these alternative methods are more difficult to implement in an airtight environment. Accordingly, the immersion method discussed above is preferred.

After subjecting the semiconductor to the etchant, the semiconductor is rinsed with water as discussed above. The semiconductor is then dried. The drying removes the deionized water remaining on the surface of the semiconductor and any minute amounts of hydrofluoric acid that were not removed by the water rinse. The drying preferably takes place at a temperature between 80 to 200° C. in an inert atmosphere such as nitrogen. The inert atmosphere prevents the re-growth of the oxide film.

EXAMPLES OF ETCHING CONDITIONS

To illustrate the improvement provided by the present invention, a p-type semiconductor (2-inch diameter) grown on a sapphire substrate was used as the group III-nitride semiconductor. The semiconductor's surface was cleaned as outlined below. Two similar substrates were used as controls. One was also cleaned using HCl with the same process, the other was processed without any etchant. All of the samples were plated with nickel electrodes and the current versus voltage curve for each sample was measured.

The process steps were carried out in an airtight system in a nitrogen atmosphere. GaN-based semiconductors were utilized in the first set of tests. The GaN semiconductors were boiled for 5 minutes in trichloroethylene, immersed in methanol, and then ultrasonically agitated for 5 minutes. The substrates were then washed by flowing deionized water at 25° C. over the entire surface of the sample at a flow rate of 1 liter/minute.

Next the samples were treated with the various etchants. The substrate that was treated with the etchant of the present invention was immersed for 30 seconds in a container filled with a 50% HF aqueous solution of hydrofluoric acid. The controls were either not treated or treated by immersion in a 35% aqueous solution of HCl for 30 seconds.

The remaining steps were the same for all samples. The samples were washed by flowing deionized water at 25° C. over the entire surface of the semiconductor at a flow rate of 1 liter/minute for 5 minutes. The samples were then dried in an electric furnace at 110° C. for 10 minutes. Nickel electrodes were then deposited on one side of the semiconductor.

The voltage versus current curve for each of the semiconductor elements was then measured. The results are shown in FIG. 1. As can be seen from the figure, the sample treated by the method of the present invention (Curve 1) exhibited substantially lower drive voltages compared to the control treated with HCl (Curve 3) or the control that was not etched (Curve 2).

The above-described test has been repeated with other group III-nitride semiconductor materials such as AlGaN and GaInN with similar results. In each case, the driving voltages obtained using the method of the present invention were significantly less than those obtained using HCl or no etchant.

The use of other etchant protocols does not alter the results obtained with the method of the present invention provided the etching procedure includes an etching step in HF. For example, a GaN substrate was processed as described above except that the etching step consisted of immersing the sample for 5 minutes in a container filled with aqua regia and then immersing the sample for 10 minutes in a container filled with a 50% aqueous hydrofluoric acid solution. The aqua regia consisted of 60% nitric acid and 35% hydrochloric acid. This semiconductor element had essentially the same driving voltage curve as shown in FIG. 1 for HF etchant described above.

Various modifications to the present invention will become apparent to those skilled in the art from the foregoing description and accompanying drawings. Accordingly, the present invention is to be limited solely by the scope of the following claims.

What is claimed is:

1. In a method for cleaning a group III-nitride-based semiconductor surface, the improvement comprising the step of bringing said semiconductor surface into contact with an etchant solution comprising hydrofluoric acid.

2. The method of claim 1 wherein said hydrofluoric acid is present in a concentration greater than 5% by weight.

3. The method of claim 1 wherein said etchant solution is maintained at a temperature between 10 to 100° C.

4. The method of claim 1 wherein said step of bringing said semiconductor surface into contact with said etchant solution is carried out in an inert atmosphere.

5. The method of claim 1 wherein said semiconductor is in contact with said etchant solution for a time period between 30 seconds and 60 minutes.

6. The method of claim 1 wherein said etchant solution also includes an acid chosen from the group consisting of nitric acid and hydrochloric acid.

* * * * *